(12) United States Patent
Xiang et al.

(10) Patent No.: US 11,374,038 B2
(45) Date of Patent: Jun. 28, 2022

(54) ARRAY SUBSTRATE HAVING PROTECTION REGION ON SAME LAYER AS GATE INSULATING LAYER AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Ming Xiang, Hubei (CN); Xing Ming, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 281 days.

(21) Appl. No.: 16/498,008

(22) PCT Filed: Apr. 15, 2019

(86) PCT No.: PCT/CN2019/082641
§ 371 (c)(1),
(2) Date: Sep. 26, 2019

(87) PCT Pub. No.: WO2020/155399
PCT Pub. Date: Aug. 6, 2020

(65) Prior Publication Data
US 2020/0251504 A1    Aug. 6, 2020

(30) Foreign Application Priority Data

Jan. 31, 2019   (CN) .......................... 201910100218.7

(51) Int. Cl.
*H01L 27/12*      (2006.01)
*H01L 21/027*     (2006.01)
(Continued)

(52) U.S. Cl.
CPC ...... *H01L 27/1288* (2013.01); *H01L 21/0273* (2013.01); *H01L 21/3115* (2013.01);
(Continued)

(58) Field of Classification Search
CPC ............ H01L 27/1288; H01L 21/0273; H01L 29/78675; H01L 21/3115; H01L 27/1222; H01L 27/1248; H01L 29/66757
(Continued)

(56) References Cited

U.S. PATENT DOCUMENTS

2011/0175080 A1    7/2011   Kim et al.
2017/0141231 A1    5/2017   Matsumoto et al.
(Continued)

FOREIGN PATENT DOCUMENTS

CN      102130177 A    7/2011
CN      106847930 A    6/2017

*Primary Examiner* — Xia L Cross
(74) *Attorney, Agent, or Firm* — Mark M. Friedman

(57) ABSTRACT

An array substrate and a manufacturing method thereof, wherein the array substrate includes a substrate; an active layer disposed on the substrate; a gate insulating layer disposed on the active layer; a gate disposed on the gate insulating layer; and a protection region dispose between the active layer and the gate, wherein the protection region is disposed on two sides of the gate and disposed on a same layer as the gate insulating layer.

4 Claims, 4 Drawing Sheets

(51) Int. Cl.
    *H01L 29/786*      (2006.01)
    *H01L 29/66*       (2006.01)
    *H01L 21/3115*     (2006.01)

(52) U.S. Cl.
    CPC ...... *H01L 27/1222* (2013.01); *H01L 27/1248* (2013.01); *H01L 29/66757* (2013.01); *H01L 29/78675* (2013.01)

(58) Field of Classification Search
    USPC .......................................................... 257/66
    See application file for complete search history.

(56) References Cited

U.S. PATENT DOCUMENTS

2018/0158954 A1*  6/2018  Matsumoto ....... H01L 29/78696
2018/0240910 A1*  8/2018  Khang .............. H01L 21/31155

* cited by examiner

ARRAY SUBSTRATE HAVING PROTECTION REGION ON SAME LAYER AS GATE INSULATING LAYER AND MANUFACTURING METHOD THEREOF

BACKGROUND

1. Field of Invention

The present disclosure relates to the field of display technology, and more particularly to an array substrate and a manufacturing method thereof.

2. Description of the Prior Art

Present thin-film transistor structure design generally adopts a lightly doped source or drain structure design, in order to increase reliability of thin-film transistor devices and reduce leakage under a working condition. Doping a low ion injection between the source or the drain and a channel forms a concentration buffer (equivalent to a large series resistor), reducing a magnetic field of the source or the drain edges in this region, thereby reducing probability of hot carrier generation.

Polysilicon lattice is easily damaged, when ions of a high-energy are injected into the polysilicon. In a subsequent hydrogenation process and an activation process, the activation process can repair the damaged lattice of the and make impurities to enter an active place. The hydrogenation process fills unbonded bonds or unsaturated bonds of polysilicon atoms with hydrogen atoms to reduce numbers of unsteady states, thereby increasing carrier mobility of the polysilicon and uniformity of a threshold voltage.

Therefore, an array substrate is currently needed to solve above problem.

SUMMARY

The present disclosure provides an array substrate and a manufacturing method thereof, solving a technical problem that present array substrate has an increased carrier mobility of a polysilicon layer.

To solve the technical problem above, the present disclosure provides a technical solution as follows:

The present disclosure provides a manufacturing method of an array substrate, including steps:
  providing a substrate;
  forming an active layer and a gate insulating layer on the substrate in sequence;
  forming a first metal layer on the gate insulating layer, and performing a first patterning process to make the first metal layer to form a gate;
  performing a first doping process on the active layer to make the active layer to form a doped region and a channel region, wherein an orthographic projection of the gate on the channel region coincides with the channel region;
  forming a first photoresist layer on the gate insulating layer, and performing a second patterning process to remove photoresists of a first region and a second region of the first photoresist layer, wherein the first region and the second region are disposed on two sides of the gate;
  performing a second doping process to the gate insulating layer to make the gate insulating layer corresponding to the first region to form a first protection region and make the gate insulating layer corresponding to the second region to form a second protection region, by using the first photoresist layer and the gate as a barrier layer; and
  stripping the first photoresist layer.

In a manufacturing method according to embodiment, the manufacturing method of the array substrate includes steps:
  forming an inter insulating layer on the gate, and forming a first hole in the inter insulating layer to expose a portion of the doped region;
  forming a second metal layer on the inter insulating layer, and performing a third patterning process to make the second metal layer to form a source and a drain;
  forming a planarization layer on the source and the drain.

In a manufacturing method according to embodiment, the inter insulating layer includes a first inter insulating layer disposed on the gate and a second inter insulating layer on the first inter insulating layer.

In a manufacturing method according to embodiment, constituent materials of the first inter insulating layer include silicon nitride, and constituent materials of the second inter insulating layer include monoxide.

In a manufacturing method according to embodiment, the step of performing a second doping process to the gate insulating layer to make the gate insulating layer corresponding to the first region to form a first protection region and make the gate insulating layer corresponding to the second region to form a second protection region, by using the first photoresist layer and the gate as a barrier layer includes:
  doping the gate insulating layer with plasma containing fluorine to make the gate insulating layer corresponding to the first region to form a first protection region containing fluorine and make the gating insulating layer corresponding to the second region to form a second protection region containing fluorine, by using the first photoresist layer and the gate as a barrier layer;
  wherein the first protection region and the second protection region are disposed on the doped region and disposed adjacent to the channel region.

In a manufacturing method according to embodiment, constituent materials of both the first protection region and the second protection region are selected from a group consisting of nitrogen fluoride silicon and fluorine silicon oxide.

The present disclosure also provides an array substrate, including:
  a substrate;
  an active layer disposed on the substrate;
  a gate insulating layer disposed on the active layer;
  a gate disposed on the gate insulating layer; and
  a protection region dispose between the active layer and the gate, wherein the protection region is disposed on two sides of the gate and disposed on a same layer as the gate insulating layer.

In an array substrate according to embodiment, the active layer includes a channel region and a doped region;
  wherein the doped region including a first doped region dispose a side of the channel region and a second doped region disposed on another side of the channel region;
  wherein a orthographic projection of the gate on the channel region coincides with the channel region.

In an array substrate according to embodiment, the protection region includes a first protection region and a second protection region;
  wherein the first protection region is disposed on the first doped region, the second protection region is disposed on the second doped region, the first protection region and the second protection region are disposed adjacent to the channel region.

In an array substrate according to embodiment, constituent materials of the protection region are selected from a group consisting of nitrogen fluoride silicon and fluorine silicon oxide.

In an array substrate according to embodiment, the array substrate includes an inter insulating layer disposed on the gate, a source and a drain disposed on the inter insulating layer, and a planarization layer disposed on the source and the drain;
wherein the inter insulating layer includes a first inter insulating layer disposed on the gate and a second inter insulating layer disposed on the first inter insulating layer.

In an array substrate according to embodiment, constituent materials of the first inter insulating layer include silicon nitride, and constituent materials of the second inter insulating layer include monoxide.

The present disclosure also provides a manufacturing method of an array substrate, including steps:
providing a substrate;
forming an active layer and a gate insulating layer on the substrate in sequence;
forming a first metal layer on the gate insulating layer, and performing a first patterning process to make the first metal layer to form a gate;
performing a first doping process on the active layer to make the active layer to form a doped region and a channel region;
forming a first photoresist layer on the gate insulating layer, and performing a second pattering process to remove photoresists of a first region and a second region of the first photoresist layer, wherein the first region and the second region are disposed on two sides of the gate;
performing a second doping process to the gate insulating layer to make the gate insulating layer corresponding to the first region to form a first protection region and make the gate insulating layer corresponding to the second region to form a second protection region, by using the first photoresist layer and the gate as a barrier layer;
stripping the first photoresist layer.

In a manufacturing method according to an embodiment, the manufacturing method of the array substrate includes steps:
forming an inter insulating layer on the gate, and forming a first hole in the inter insulating layer to expose a portion of the doped region;
forming a second metal layer on the inter insulating layer, and performing a third pattering process to make the second metal layer to form a source and a drain;
forming a planarization layer on the source and the drain.

In a manufacturing method according to embodiment, the inter insulating layer includes a first inter insulating layer disposed on the gate and a second inter insulating layer on the first inter insulating layer.

In a manufacturing method according to embodiment, constituent materials of the first inter insulating layer include silicon nitride, and constituent materials of the second inter insulating layer include monoxide.

In a manufacturing method according to embodiment, the step of performing a second doping process to the gate insulating layer to make the gate insulating layer corresponding to the first region to form a first protection region and make the gate insulating layer corresponding to the second region to form a second protection region, by using the first photoresist layer and the gate as a barrier layer includes:
doping the gate insulating layer with plasma containing fluorine to make the gate insulating layer corresponding to the first region to form a first protection region containing fluorine and make the gating insulating layer corresponding to the second region to form a second protection region containing fluorine, by using the first photoresist layer and the gate as a barrier layer;
wherein the first protection region and the second protection region are disposed on the doped region and disposed adjacent to the channel region.

In a manufacturing method according to embodiment, constituent materials of both the first protection region and the second protection region are selected from a group consisting of nitrogen fluoride silicon and fluorine silicon oxide.

Beneficial effects of the present disclosure are that the present disclosure can prevent the hydrogen atoms generated in the following hydrogenation process entering the doped region of the active layer 103 and avoid the technical problem that the active layer 103 has an increased carrier mobility, by disposing a part regions on the active layer 103 as a fluorine-containing protection layer.

BRIEF DESCRIPTION OF DRAWINGS

In order to more clearly illustrate the technical solution in the present disclosure or in the prior art, the following will illustrate the figures used for describing the embodiments or the prior art. It is obvious that the following figures are only some embodiments of the present disclosure. For a person of ordinary skill in the art, without creative effort, other figures can also be obtained according to these figures.

DETAILED DESCRIPTION OF PREFERRED EMBODIMENTS

Figure 1:
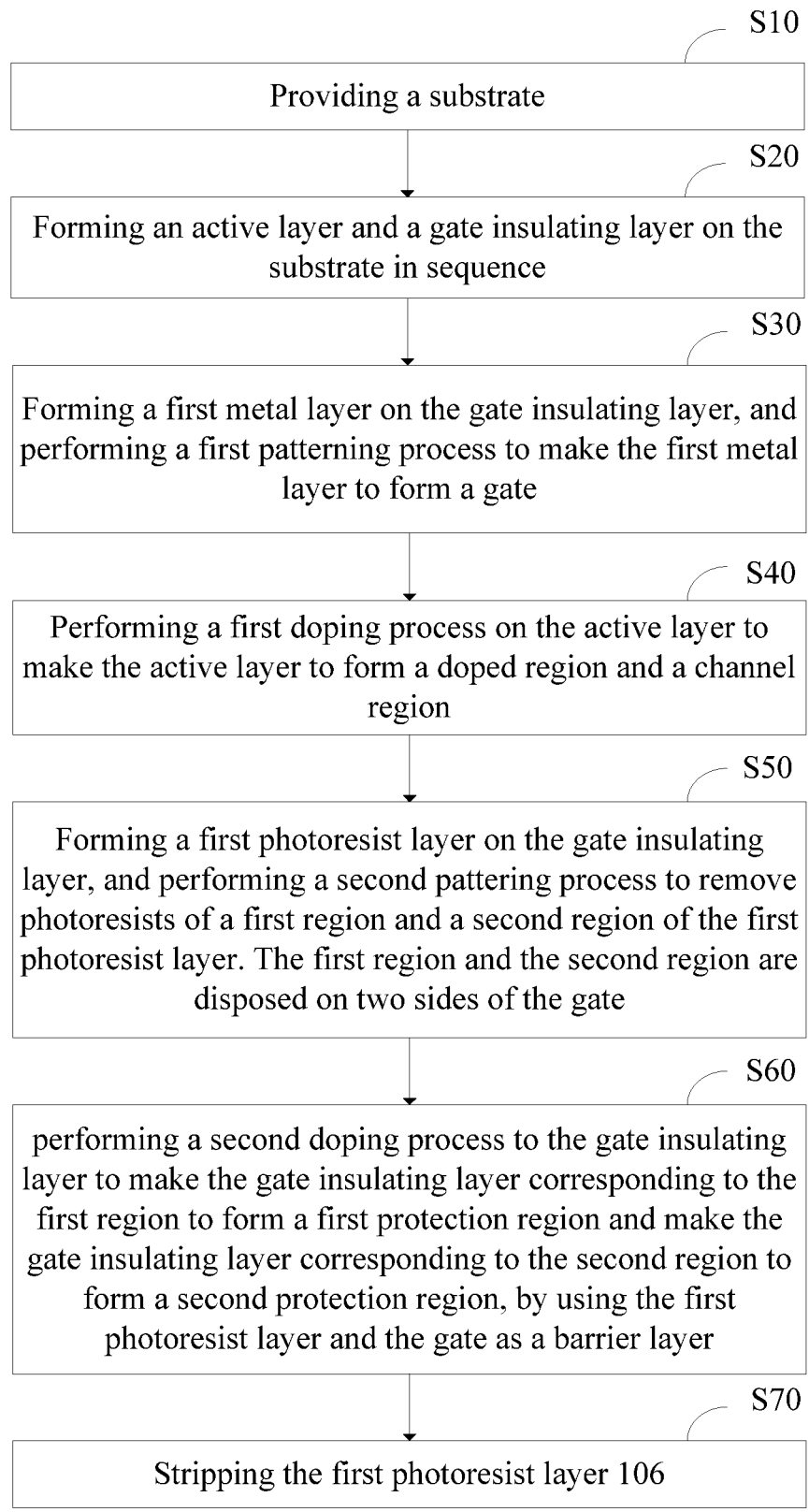
FIG. 1 is a step diagram of a manufacturing method of an array substrate according to the present disclosure.

The following description of each embodiment with reference to the accompanying drawings is used to exemplify a specific embodiment which may be carried out in the present disclosure. Directional terms mentioned in the present disclosure, such as "top", "bottom", "front", "back", "left", "right", "inside", "outside", "side" etc., are only used with reference to the orientation of the accompanying drawings. Therefore, the used directional terms are intended to illustrate, but not to limit, the present disclosure. In the accompanying drawings, the identical reference numerals denote the similar elements.

Please refer to FIG. 1, FIG. 1 is a step diagram of a manufacturing method of an array substrate according to the present disclosure.

Please refer to FIG. 2A to FIG. 2G, FIG. 2A to FIG. 2G are process step diagrams of the manufacturing method of the array substrate according to the present disclosure. The manufacturing method of the array substrate 100 includes:

S10. Providing a substrate.

Figure 2A:
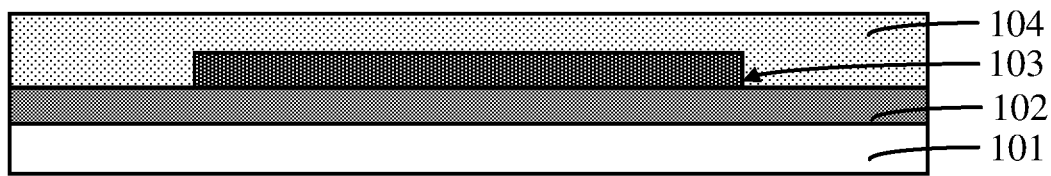
FIG. 2A to FIG. 2G are process step diagrams of a manufacturing method of an array substrate according to the present disclosure.

Please refer to FIG. 2A, according to an embodiment, a raw material of the substrate 101 can be one of glass, quartz, resin and so on.

According to an embodiment, the substrate 101 can also be flexible substrate. A material of the flexible substrate can be PI (polyimide).

S20. Forming an active layer and a gate insulating layer on the substrate in sequence.

Please refer to FIG. 2A, step S20 specifically includes:

S201. Forming a buffer layer on the substrate.

The buffer layer 102 formed on the substrate 101 is mainly configured to buffer pressure between film layer structures, and can also have function of preventing water and oxygen.

S202. Forming the active layer on the buffer layer.

A material of the active layer 103 is polycrystalline silicon. The active layer 103 is patterned to form a pattern as shown in FIG. 2A.

S203. Forming the gate insulating layer on the active layer.

The gate insulating layer 104 is disposed in a whole layer, and cover the active layer 103 completely. The gate insulating layer 104 is configured to separate the active layer 103 and a metal layer disposed on the gate insulating layer 104.

According to an embodiment, material of the gate insulating layer 104 is usually silicon nitride, and also can be silicon oxide, silicon oxynitride and so on.

S30. Forming a first metal layer on the gate insulating layer 104, and performing a first patterning process to make the first metal layer to form a gate 105.

Figure 2B:
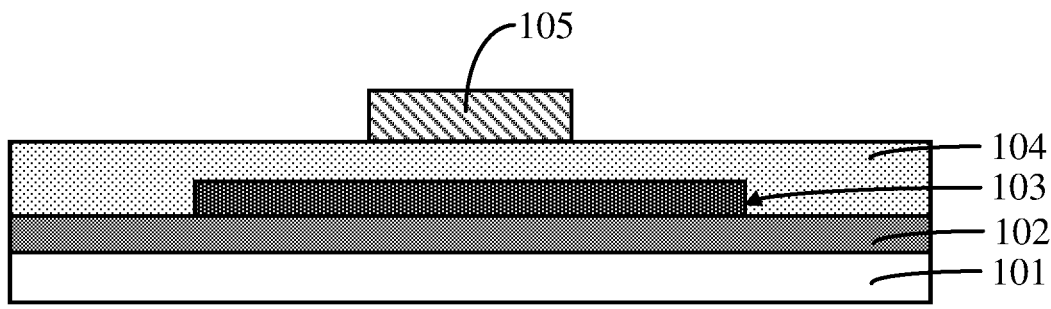

Please refer to FIG. 2B, a material of the gate 105 can be one of a metal of molybdenum, aluminum, an aluminum-nickel alloy, a molybdenum-tungsten alloy, chromium, or copper and so on, and can be a composition including the metal materials above. According to an embodiment, the material of the gate 105 can be molybdenum.

In this step, forming the first metal layer on the gate insulating layer 104 at first. Coating a photoresist layer on the first metal layer. Making the first metal layer to be the gate 105 as shown in FIG. 2B after a composition process including a masking exposure (not shown), a development, and an etching pattern. And peeling off the photoresist layer.

S40. Performing a first doping process on the active layer 103 to make the active layer 103 to form a doped region and a channel region.

Figure 2C:
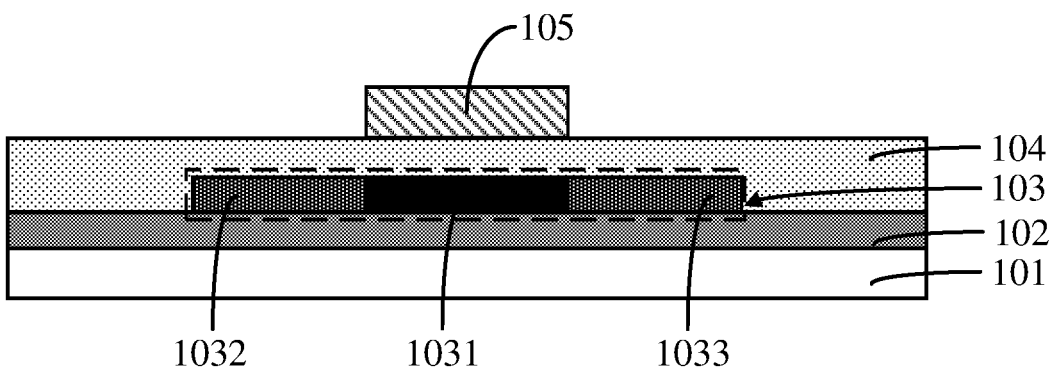

Please refer to FIG. 2C, performing the first doping process on the active layer 103 by using the gate 105 as a barrier layer to make the active layer 103 to form a doped region and a channel region 1031. The doped region includes a first doped region 1032 and a second doped region 1033 which are disposed on two sides of the channel region 1031.

According to an embodiment, ions doped in the first doping process are high concentration phosphonium ions. The channel region 1031 is not ion doped due to a barrier of the gate 105.

According to an embodiment, an orthographic projection of the gate 105 on the channel region 1031 coincides with the channel region 1031.

S50. Forming a first photoresist layer on the gate insulating layer 104, and performing a second patterning process to remove photoresists of a first region 1061 and a second region 1062 of the first photoresist layer. The first region 1061 and the second region 1062 are disposed on two sides of the gate 105.

Figure 2D:
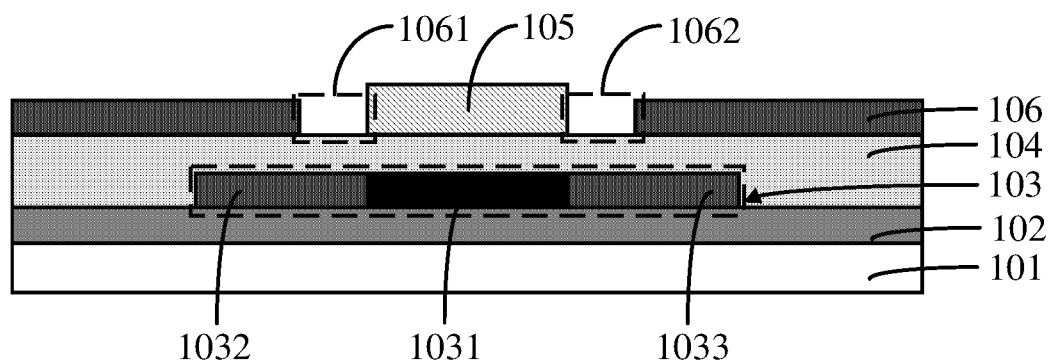

Please refer to FIG. 2D, forming the first photoresist layer 106 on the gate insulating layer 104 at first. Performing a composition process including a masking exposure (not shown), and development, and removing photoresists of the first region 1061 and the second region 1062 of the first photoresist layer.

According to an embodiment, the first region 1061 and the second region 1062 are disposed on two sides of the gate 105. The first region 1061 is corresponding to the first doped region 1032, and the second region 1062 is corresponding to the second doped region 1033.

S60. performing a second doping process to the gate insulating layer 104 to make the gate insulating layer 104 corresponding to the first region 1061 to form a first protection region 1041 and make the gate insulating layer 104 corresponding to the second region 1062 to form a second protection region 1042, by using the first photoresist layer 106 and the gate 105 as a barrier layer.

Figure 2E:
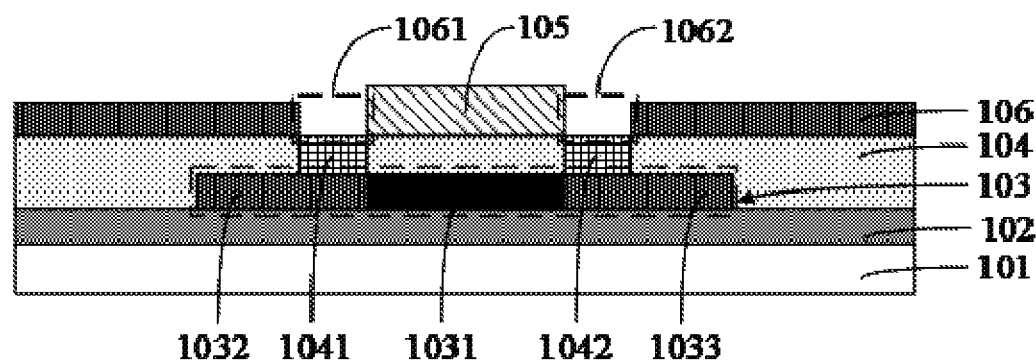

Please refer to FIG. 2E, the step is mainly about performing the second doping process to the gate insulating layer 104 by using the first photoresist layer 106 and the gate 105 as a barrier layer.

The gate insulating layer 104 corresponding to the first region 1061 forms the first protection region 1041 and the gate insulating layer 104 corresponding to the second region 1062 forms the second protection region 1042, because the gate insulating layer 104 corresponding to both the first region 1061 and the second region 1062 is unblocked.

The first protection region 1041 and the second protection region 1042 are disposed on the doped region and disposed adjacent to the channel region 1031.

According to an embodiment, the first protection region 1041 and the second protection region 1042 are disposed between the gate 105 and the active layer 103. The first protection region 1041 is disposed on the first doped region 1032, and an area of the first protection region 1041 is not larger than an area of the first doped region 1032. The second protection region 1042 is disposed on the second doped region 1033, and an area of the second protection region 1042 is not larger than an area of the second doped region 1033.

According to an embodiment, ions doped in the second doping process are fluoride ions. The gate insulating layer 104 are formed to be nitrogen fluoride silicon or fluoride oxide silicon by ion doping, since materials of the gate insulating layer 104 usually includes silicon nitride or monoxide.

S70. Stripping the first photoresist layer 106.

S80. forming an inter insulating layer 107 on the gate 105, and forming a first hole 108 in the inter insulating layer 107 to expose a portion of the doped region.

Figure 2F:
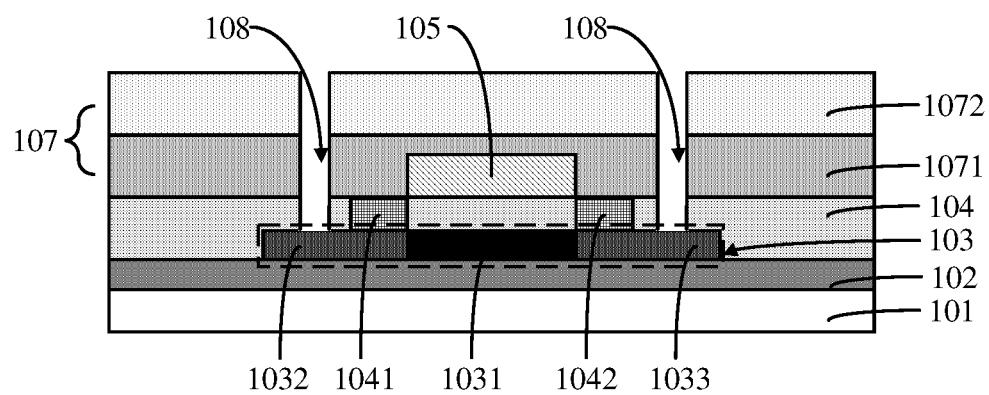

Please refer to FIG. 2F, forming a first inter insulating layer 1071 on the gate 105 and making the first inter insulating layer 1071 cover the gate 105. And then, forming a second inter insulating layer 1072 on the first inter insulating layer 1071. At last, forming the first hole 108 on the first inter insulating layer 1071 and the second inter insulating layer 1072 to expose a portion of the doped region.

According to an embodiment, materials of the first inter insulating layer 1071 includes silicon nitride. A material of the second inter insulating layer 1072 includes monoxide.

In following hydrogenation process and activation process, hydrogen atoms in the first inter insulating layer 1071 pass through the gate insulating layer 104 into both the first doped region 1031 and the second doped region 1032. Since the first protection region 1041 and the second protection region 1042 of the gate insulating layer 104 have fluorine atoms which can prevent the hydrogen atoms from diffusing downward. A polysilicon layer corresponding to the first protection region 1041 and the second protection region 1042 still retains part of lattice defects and becomes a "buffer" which can reduce leakage current of a thin-film transistor in a working state, preventing increasing the carrier mobility of the active layer 103.

S90. Forming a second metal layer on the inter insulating layer 107, and performing a third patterning process to make the second metal layer to form a source and a drain 109.

Figure 2G:
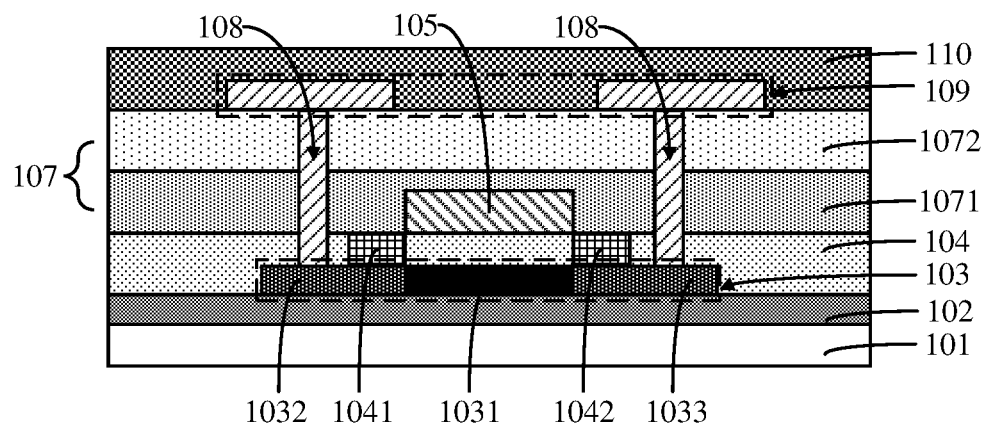

Please refer to FIG. 2G, a material of the source and drain 109 can be one of a metal of molybdenum, aluminum, an aluminum-nickel alloy, a molybdenum-tungsten alloy, chromium, or copper and so on, and can be a composition including the metal materials above. According to an embodiment, the material of the source and drain 109 can be a titanium-aluminium alloy.

In this step, forming the second metal layer on the second inter insulating layer 1072 at first. Coating a photoresist layer on the second metal layer. Making the second metal layer to be the source and drain 109 as shown in FIG. 2G after a composition process including a masking exposure (not shown), a development, and an etching pattern. And peeling off the photoresist layer.

The source and drain 109 is electrically connected to both the first doped region 1031 and the second doped region 1032 by the first hole 108.

S100. Forming a planarization layer 110 on the source and the drain 109.

Please refer to FIG. 2G, the planarization layer 110 disposed on the source and the drain 109 is configured to ensure a smoothness of films. According to an embodiment, a material of the planarization layer 110 can be an organic material.

The present disclosure can prevent the hydrogen atoms generated in the following hydrogenation process entering the doped region of the active layer 103 and avoid the technical problem that the active layer 103 has an increased carrier mobility, by disposing a part regions on the active layer 103 as a fluorine-containing protection layer.

Figure 3:
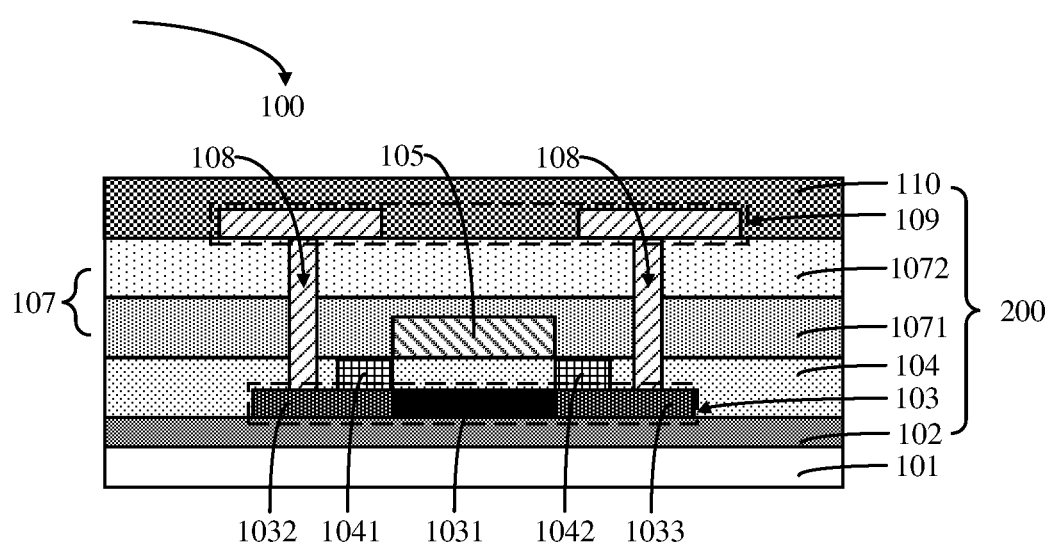
FIG. 3 is a structural diagram of a film layer of an array substrate according to the present disclosure.

Please refer to FIG. 3, FIG. 3 is a structural diagram of a film layer of an array substrate according to the present disclosure.

The array substrate 100 includes a substrate and a thin-film transistor layer disposed on the substrate 101.

According to an embodiment, a raw material of the substrate 101 can be one of glass, quartz, resin and so on.

According to an embodiment, the substrate 101 can also be flexible substrate. A material of the flexible substrate can be PI (polyimide).

The thin-film transistor layer 200 includes a structure like barrier layer etching type, back channel etching type or top gate thin-film transistor type, and is not particularly limited. For example, the thin-film transistor type layer 200 of the top gate thin-film transistor type includes a buffer layer 102, an active layer 103, a gate insulating layer 104, a gate 105, a inter insulating layer 107, a source and drain 109, and planarization layer 110.

The buffer layer 102 formed on the substrate 101 is mainly configured to buffer pressure between film layer structures, and can also have function of preventing water and oxygen.

The active layer 103 is formed on the buffer layer 102. According to an embodiment, a material of the active layer 103 is polycrystalline silicon.

The active layer 103 forms a doped region and a channel region 1031 by performing a first doping process. The doped region includes a first doped region 1032 and a second doped region 1033. The first doped region 1032 is disposed on a side of the channel region 1031, and the second doped region 1033 is disposed on another side of the channel region 1031.

According to an embodiment, ions doped in the first doping process are high concentration phosphonium ions. The channel region 1031 is not ion doped due to a barrier of the gate 105.

According to an embodiment, an orthographic projection of the gate 105 on the channel region 1031 coincides with the channel region 1031.

The gate insulating layer 104 is formed on the active layer 103. The gate insulating layer 104 is disposed in a whole layer, and cover the active layer 103 completely. The gate insulating layer 104 is configured to separate the active layer 103 and a metal layer disposed on the gate insulating layer 104.

According to an embodiment, material of the gate insulating layer 104 is usually silicon nitride, and also can be silicon oxide, silicon oxynitride and so on.

A protection region is disposed on the gate insulating layer 104. The protection region includes a first protection region 1041 and a second protection region 1042. The first protection region 1041 and the second protection region 1042 are disposed on the doped region and disposed adjacent to the channel region 1031.

According to an embodiment, the first protection region 1041 and the second protection region 1042 are disposed between the gate 105 and the active 103. The first protection region 1041 is disposed on the first doped region 1032, and an area of the first protection region 1041 is not larger than an area of the first doped region 1032. The second protection region 1042 is disposed on the second doped region 1033, and an area of the second protection region 1042 is not larger than an area of the second doped region 1033.

According to an embodiment, the protection region is formed by performing the second doped process on the gate insulating layer 104 corresponding to the protection region.

According to an embodiment, ions doped in the second doping process are fluoride ions. The gate insulating layer 104 are formed to be nitrogen fluoride silicon or fluoride oxide silicon by ion doping, since materials of the gate insulating layer 104 usually includes silicon nitride or monoxide.

According to an embodiment, materials of the protection region includes one or a composition of nitrogen fluoride silicon or fluoride oxide silicon.

The gate 105 is formed on the first insulating layer 304. a material of the gate 105 can be one of a metal of a molybdenum, an aluminum, an aluminum-nickel alloy, a molybdenum-tungsten alloy, a chromium, or a copper and so on, and can be a composition including the metal materials above. According to an embodiment, the material of the gate 105 can be a molybdenum.

According to an embodiment, an orthographic projection of the gate 105 on the channel region 1031 coincides with the channel region 1031.

The inter insulating layer 107 is disposed on the gate 105. The inter insulating layer 107 includes a first inter insulating layer 1071 disposed on the gate and a second inter insulating layer 1072 disposed on the inter insulating layer 1071.

According to an embodiment, materials of the first inter insulating layer 1071 includes silicon nitride. A material of the second inter insulating layer 1072 includes monoxide.

The first hole 108 runs through the first inter insulating layer 1071 and the second inter insulating layer 1072, exposing a portion of the first doped region 1032 and the second doped region 1033.

The source and drain 109 is formed on the second inter insulating layer 1072. The source and drain 109 is electrically connected to both the first doped region 1031 and the second doped region 1032 by the first hole 108.

According to an embodiment, materials of the source and drain 109 is the same with or not the same with the materials of the gate 105. According to an embodiment, the material of the source and drain 109 can be a titanium-aluminium alloy.

The planarization layer 110 disposed on the source and the drain 109 is configured to ensure a smoothness of films. According to an embodiment, a material of the planarization layer 110 can be an organic material.

In following hydrogenation process and activation process, hydrogen atoms in the first inter insulating layer 1071 pass through the gate insulating layer 104 into both the first doped region 1031 and the second doped region 1032. Since the first protection region 1041 and the second protection region 1042 of the gate insulating layer 104 have fluorine atoms which can prevent the hydrogen atoms from diffusing downward. A polysilicon layer corresponding to the first protection region 1041 and the second protection region 1042 still retains part of lattice defects and becomes a "buffer" which can reduce leakage current of a thin-film transistor in a working state, preventing increasing the carrier mobility of the active layer 103.

The present disclosure can prevent the hydrogen atoms generated in the following hydrogenation process entering the doped region of the active layer 103 and avoid the technical problem that the active layer 103 has an increased carrier mobility, by disposing a part regions on the active layer 103 as a fluorine-containing protection layer.

The present disclosure provides an array substrate and a manufacturing method thereof. The array substrate includes a substrate; an active layer disposed on the substrate; a gate insulating layer disposed on the active layer; a gate disposed on the gate insulating layer; and a protection region dispose between the active layer and the gate, wherein the protection region is disposed on two sides of the gate and disposed on a same layer as the gate insulating layer. The present disclosure can prevent the hydrogen atoms generated in the following hydrogenation process entering the doped region of the active layer and avoid the technical problem that the active layer has an increased carrier mobility, by disposing a part regions on the active layer as a fluorine-containing protection layer.

The present disclosure is described in detail in accordance with the above contents with the specific preferred examples. However, this present disclosure is not limited to the specific examples. For a person of ordinary skill in the art, on the premise of keeping the conception of the present disclosure, the technical personnel can also make simple deductions or replacements, all of which should be considered to belong to the protection scope of the present disclosure.

What is claimed is:

1. An array substrate, comprising:
   a substrate;
   an active layer disposed on the substrate, wherein the active layer comprises a channel region and a doped region, the doped region comprising a first doped region dispose a side of the channel region and a second doped region disposed on another side of the channel region;
   a gate insulating layer disposed on the active layer;
   a gate disposed on the gate insulating layer, wherein an orthographic projection of the gate on the channel region coincides with the channel region; and
   a protection region dispose between the active layer and the gate, wherein the protection region is disposed on two sides of the gate and disposed on a same layer as the gate insulating layer, the protection region comprises a first protection region and a second protection region respectively disposed on the first doped region and the second doped region, the first protection region and the second protection region are disposed adjacent to the channel region, constituent materials of the protection region are different form constituent materials of the gate insulating layer, an orthographic projection of the first protection region on the doped region is within the first doped region, and an orthographic projection of the second protection region on the doped region is within the second doped region.

2. The array substrate as claimed in the claim 1, wherein the constituent materials of the protection region are selected from a group consisting of nitrogen fluoride silicon and fluorine silicon oxide.

3. The array substrate as claimed in the claim 1, wherein the array substrate comprises an inter insulating layer disposed on the gate, a source and a drain disposed on the inter insulating layer, and a planarization layer disposed on the source and the drain;
   wherein the inter insulating layer comprises a first inter insulating layer disposed on the gate and a second inter insulating layer disposed on the first inter insulating layer.

4. The array substrate as claimed in the claim 3, wherein constituent materials of the first inter insulating layer comprise silicon nitride, and constituent materials of the second inter insulating layer comprise monoxide.

* * * * *